United States Patent [19]
Heinen

[11] Patent Number: 4,987,576
[45] Date of Patent: Jan. 22, 1991

[54] ELECTRICALLY TUNABLE SEMICONDUCTOR LASER WITH RIDGE WAVEGUIDE

[75] Inventor: Jochen Heinen, Haar, Fed. Rep. of Germany

[73] Assignee: Siemens Aktiengesellschaft, Berlin and Munich, Fed. Rep. of Germany

[21] Appl. No.: 431,236

[22] Filed: Nov. 3, 1989

[30] Foreign Application Priority Data

Nov. 30, 1988 [DE] Fed. Rep. of Germany ....... 3840411

[51] Int. Cl.$^5$ .............................................. H01S 3/19
[52] U.S. Cl. .......................................... 372/46; 372/45
[58] Field of Search ................ 372/46, 45, 47, 43, 372/44

[56] References Cited

U.S. PATENT DOCUMENTS

| | | | |
|---|---|---|---|
| 4,408,330 | 10/1983 | An | 372/45 |
| 4,503,540 | 3/1985 | Nakashima et al. | 372/47 |
| 4,747,110 | 5/1988 | Takahashi et al. | 372/50 |

FOREIGN PATENT DOCUMENTS

| | | |
|---|---|---|
| 0173269A2 | 3/1986 | European Pat. Off. . |
| 0260439A2 | 3/1988 | European Pat. Off. . |
| 0296066A2 | 12/1988 | European Pat. Off. . |
| 0297654A1 | 1/1989 | European Pat. Off. . |
| 2816269A1 | 10/1969 | Fed. Rep. of Germany . |
| 3124633A1 | 3/1982 | Fed. Rep. of Germany . |
| 3434741A1 | 4/1986 | Fed. Rep. of Germany . |
| 3708666A1 | 9/1988 | Fed. Rep. of Germany . |
| 60-34088 | 2/1985 | Japan . |
| 61-78184 | 4/1986 | Japan . |
| 61-239687 | 10/1986 | Japan . |
| 62-114284 | 5/1987 | Japan . |

OTHER PUBLICATIONS

"Continuously Tunable Distributed Feedback Laser Diode", by N. K. Dutta et al, Appl. Phys. Letter, 47, 981–983, (1985).

*Primary Examiner*—Georgia Epps
*Attorney, Agent, or Firm*—Hill, Van Santen, Steadman & Simpson

[57] ABSTRACT

Electrically tunable semiconductor laser with ridge waveguide. A semiconductor laser with MCRW structure has an intermediate layer grown on an active layer, a stripe-shaped tuning layer that is flanked by a first lateral region having a first tuning contact and by a second lateral region having a second tuning contact, a cover layer and a contact layer. The supply of power occurs via a substrate contact and via a ridge contact and the laser is tunable with currents injected into the tuning layer via the tuning contacts.

11 Claims, 1 Drawing Sheet

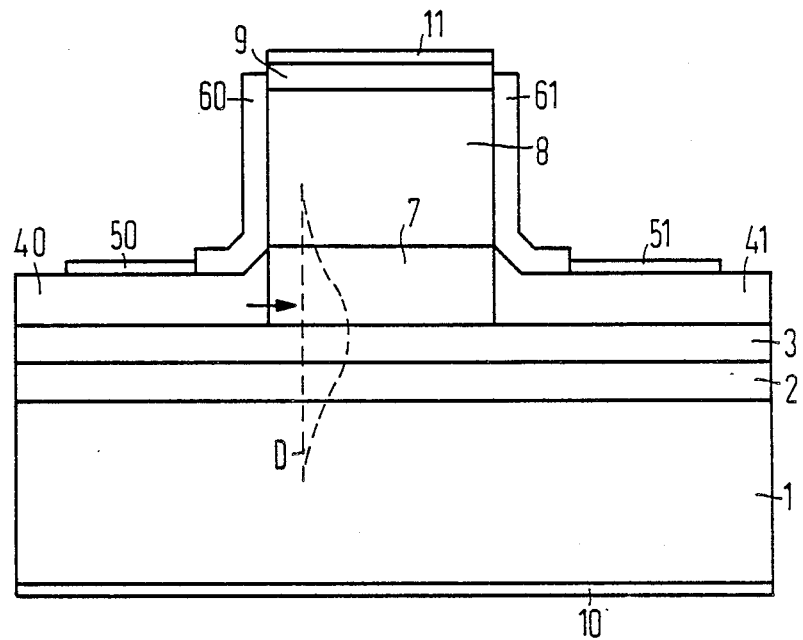

ELECTRICALLY TUNABLE SEMICONDUCTOR LASER WITH RIDGE WAVEGUIDE

BACKGROUND OF THE INVENTION

Lasers whose wavelength of emitted radiation is tunable within a certain range are utilized in various semiconductor laser applications such as, for example, in optical communications technology for heterodyne reception or wavelength multiplex. The aim is to realize the tunability not via slow thermal effects, but with fast electro-optical effects. One method of wavelength tuning is to shift the refractive index in a part of the light-conducting semiconductor material resulting from charge carriers.

Presently, electrically tunable lasers exist in configurations wherein opto-electron active stripe-shaped semiconductor regions are arranged in succession in the direction of the guided light. At least one region is fashioned as a semiconductor laser. The refractive index in at least one additional region is modified, for example, by injecting charge carriers into the light-guiding strips, thus producing a change in the emitted wavelength. Instead of being arranged in succession, the laser and tuning region can also be arranged on top of one another. No arrangement is known wherein this principle of a laser zone and a tuning zone arranged on top of one another is used in a laser structure having a ridge waveguide.

European reference EP No. 0 173 269 A2 discloses a semiconductor laser structure wherein an active region is present in a longitudinal arrangement between a first control region and a second control region each of which is provided with electrodes for control. The tuning of this semiconductor occurs by a continuous variation of the current intensities supplied to these tuning electrodes.

An article by N. K. Dutta et al, "Continuously Tunable Distributed Feedback Laser Diode", Appl. Phys. Lett. 47, 981–983, 1985, discloses a tunable semiconductor laser wherein a substrate of InP acts as a thermoelectric element whose components are formed by upper and lower contacts on the substrate. A temperature difference between these two components can be produced by the Peltier effect when a current is applied to both of these contacts. The functioning of the tuning in this structure is thus composed of a combination of resistance heating and Peltier cooling.

European reference EP No. 0 297 654 A1 discloses a semiconductor laser whose layer structure allows the injection of high-energy electrons into the active layer. A shorter wavelength of light emitted by this laser is thus achieved.

European reference EP No. 0 296 066 A2 discloses a semiconductor laser that has a MQW-layer arranged transversely relative to the actual active layer. During operation of the laser, a blocking voltage with which the electrical field in this MQW-layer is controlled is applied to one MQW-layer via a separate contact and the wavelength can be varied in this fashion.

SUMMARY OF THE INVENTION

It is an object of the present invention to provide an electrically tunable semiconductor laser having a ridge waveguide. The object is achieved with a semiconductor laser having a MCRW structure on a substrate of III–V semiconductor material, having an active layer, a ridge, a substrate contact and a ridge contact. The laser has the active layer, an intermediate layer, a stripe-shaped tuning layer flanked by a first lateral region layer and by a second lateral region layer. These layers are grown onto the substrate on top of one another, and a stripe-shaped cover layer and a contact layer is grown on top of one another above this tuning layer. A substrate contact is applied on a side opposed from the overgrown side of the substrate and the ridge contact is applied on the contact layer. The first lateral region layer is provided with a first tuning contact and the second lateral region layer is provided with a second tuning contact. A first passivation layer is applied onto a region of a surface of the semiconductor material between the first tuning contact and the ridge contact. A second passivation layer is applied on a region of the surface of the semiconductor material between the second tuning contact and the ridge contact.

In one embodiment the substrate, the first lateral region layer and the second lateral region layer are n-conductively doped; the intermediate layer, the tuning layer and the cover layer are p-conductively doped; and the contact layer is highly p-conductively doped to a sufficient degree for low-impedance transition to the ridge contact. In an alternative embodiment the substrate, the first lateral region layer and the second lateral region layer are p-conductively doped; the intermediate layer, the tuning layer and the cover layer are n-conductively doped; and the contact layer is highly n-conductively doped to a sufficient degree for low-impedance transition to the ridge contact. Furthermore, in a further embodiment the substrate, the intermediate layer, the first lateral region layer, the second lateral region layer and the cover layer are InP; the active layer and the tuning layer are InGaAsP; and the contact layer is InGaAs. Finally, the active layer and the tuning layer can be quaternary semiconductor material.

BRIEF DESCRIPTION OF THE DRAWING

The features of the present invention which are believed to be novel, are set forth with particularity in the appended claims. The invention, together with further objects and advantages, may best be understood by reference to the following description taken in conjunction with the accompanying drawing in which:

The single figure depicts a semiconductor laser according to the present invention.

DESCRIPTION OF THE PREFERRED EMBODIMENT

A description of the semiconductor laser of the present invention shall now follow with reference to the single figure. The tunable semiconductor laser of the present invention utilizes the effect that the refractive index of the semiconductor material decreases with increasing charge carrier density. The wavelength of light partially guided in this region is thus increased, i.e. it can be influenced within limits by an injection current.

The structure of the present invention is similar to a ridge waveguide having an MCRW structure. The active layer 2 of InGaAsP for a wavelength of 1.55 $\mu$m is grown onto the substrate 1 composed of n-conductively doped InP. A p-conductively doped intermediate layer 3 of InP is situated thereabove. A stripe-shaped tuning layer 7 of p-conductively doped InGaAsP for a wavelength of 1.3 $\mu$m is situated thereabove and a similar stripe-shaped cover layer 8 of p-conductively doped InP is located over this tuning layer 7. A highly p-conductively doped contact layer 9 of InGaAs is located on this cover layer 8 for a low-impedance transition. Laterally adjoining the tuning layer 7, a first lateral region layer 40 and a second lateral region layer 41 of n-conductively doped InP are grown onto the intermediate layer 3. The contacting of the semiconductor laser occurs via a substrate contact 10 applied surface-wide at that side of the substrate opposed from the overgrown side, via a ridge contact 11 on the contact layer 9, via a first tuning contact 50 on the first lateral region layer 40 and via a second tuning contact 51 on the second lateral region layer 41. The surface of the semiconductor material between the first tuning contact 50 and the ridge contact 11 and between the second tuning contact 51 and the ridge contact 11 is covered with a first passivation layer 60 and with a second passivation layer 61, respectively.

Proceeding from the sides, charge carriers can be injected into the tuning layer 7 via the first lateral region layer 40 together with the first tuning contact 50 situated thereon and via the second lateral region layer 41 together with the second tuning contact 51 situated thereon. The semiconductor layers of the first lateral region layer 40 and the second lateral region layer 41 are applied in a separate epitaxial process. As usual, the laser is electrically supplied or modulated via the ridge contact 11 and via the substrate contact 10. Together with the stripe-shaped tuning layer 7, the ridge composed of the cover layer 8 and contact layer 9 and the lateral region layers 40, 41 form an additional semiconductor diode.

In the described exemplary embodiment, the substrate 1 and the lateral region layers 40, 41 are n-conductively doped, the intermediate layer 3, the tuning layer 7 and the cover layer 8 are p-conductively doped, and the contact layer 9 for the low-impedance transition from the semiconductor material to the metal of the contact is highly p-conductively doped. For polarization in a flow direction, charge carriers (electrons in this exemplary embodiment) are injected into the tuning layer 7 where, surrounded by barriers on all sides, they recombine after a certain life expectancy. Dependent on the volume of the tuning layer 7, on life expectancy and on the current intensity that has been set, a corresponding charge carrier density is established in the stripe-shaped tuning layer 7. This density varies the optical refractive index of the tuning layer 7. Since the laser light is partly guided in this region with a variable refractive index, as shown by the diagram D in the figure, the effective refractive index of the semiconductor laser of the present invention and, thus, the wavelength of this laser can be varied via the current intensity applied to the first tuning contact 50 and to the second tuning contact 51.

The tuning mechanism of the present invention can be applied in lasers composed of various semiconductor materials or systems of semiconductor materials. For achieving single-mode emissions, the laser can also additionally have a DFB grating above or below the laser-active stripe. The tuning region established by the tuning layer 7 should be relatively close to the active layer 2 (less than 200 nm from the active layer 2), so that the field strength of the light is still relatively high in the tuning layer 7 as is the portion of influenced light. For the same reason, the diode of the tuning region should not be excessively thin (thickness of the tuning layer 7 should be at least 50nm). An excessively large thickness of this tuning layer 7, on the other hand, requires excessively high tuning currents for the necessary charge carrier density. The laterally grown lateral region layers 40, 41 must be so thin that the distance of the surfaces next to the ridge from the active laser layer remains small enough (thickness of the first and second lateral region layer 40, 41 and intermediate layer 3 should not be more than about 200nm together) in order to guarantee the necessary difference in refractive index compared to the ridge region and, thus, to guarantee the necessary index guidance of the ridge waveguide.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A semiconductor laser with a MCRW structure on a substrate of III-V semiconductor material, having an active layer, a ridge, a substrate contact and a ridge contact, comprising:
   the active layer, an intermediate layer, a stripe-shaped tuning layer flanked by a first lateral region layer and by a second lateral region layer being grown onto the substrate on top of one another, and a stripe-shaped cover layer and a contact layer being grown on top of one another above this tuning layer;
   a substrate contact being applied on a side opposed from the overgrown side of the substrate and the ridge contact being applied on the contact layer;
   the first lateral region layer being provided with a first tuning contact; and
   the second lateral region layer being provided with a second tuning contact.

2. The semiconductor laser according to claim 1, wherein a first passivation layer is applied onto a region of a surface of the semiconductor material between the first tuning contact and the ridge contact and wherein a second passivation layer is applied on a region of the surface of the semiconductor material between the second tuning contact and the ridge contact.

3. The semiconductor laser according to claim 1, wherein the substrate, the first lateral region layer and the second lateral region layer are n-conductively doped; wherein the intermediate layer, the tuning layer and the cover layer are p-conductively doped; and wherein the contact layer is highly p-conductively doped to a sufficient degree for low-impedance transition to the ridge contact.

4. The semiconductor laser according to claim 1, wherein the substrate, the first lateral region layer and the second lateral region layer are p-conductively doped; wherein the intermediate layer, the tuning layer and the cover layer are n-conductively doped; and wherein the contact layer is highly n-conductively doped to a sufficient degree for low-impedance transition to the ridge contact.

5. The semiconductor laser according to claim 1, wherein the substrate, the intermediate layer, the first lateral region layer, the second lateral region layer and the cover layer are InP; wherein the active layer and the tuning layer are InGaAsP; and wherein the contact layer is InGaAs.

6. The semiconductor laser according to claim 1, wherein the active layer and the tuning layer are quaternary semiconductor material.

7. A semiconductor laser with a MCRW structure on a substrate of III-V semiconductor material, having an active layer, a ridge, a substrate contact and a ridge contact, comprising:

the active layer, an intermediate layer, a stripe-shaped tuning layer flanked by a first lateral region layer and by a second lateral region layer being grown onto the substrate on top of one another, and a stripe-shaped cover layer and a contact layer being grown on top of one another above this tuning layer;

a substrate contact being applied on a side opposed from the overgrown side of the substrate and the ridge contact being applied on the contact layer;

the first lateral region layer being provided with a first tuning contact;

the second lateral region layer being provided with a second tuning contact;

a first passivation layer applied onto a region of a surface of the semiconductor material between the first tuning contact and the ridge contact; and a second passivation layer applied on a region of the surface of the semiconductor material between the second tuning contact and the ridge contact.

8. The semiconductor laser according to claim 7, wherein the substrate, the first lateral region layer and the second lateral region layer are n-conductively doped; wherein the intermediate layer, the tuning layer and the cover layer are p-conductively doped; and wherein the contact layer is highly p-conductively doped to a sufficient degree for low-impedance transition to the ridge contact.

9. The semiconductor laser according to claim 7, wherein the substrate, the first lateral region layer and the second lateral region layer are p-conductively doped; wherein the intermediate layer, the tuning layer and the cover layer are n-conductively doped; and wherein the contact layer is highly n-conductively doped to a sufficient degree for low-impedance transition to the ridge contact.

10. The semiconductor laser according to claim 7, wherein the substrate, the intermediate layer, the first lateral region layer, the second lateral region layer and the cover layer are InP; wherein the active layer and the tuning layer are InGaAsP; and wherein the contact layer is InGaAs.

11. The semiconductor laser according to claim 7, wherein the active layer and the tuning layer are quaternary semiconductor material.

* * * * *